United States Patent
Chang et al.

(10) Patent No.: US 7,589,979 B2
(45) Date of Patent: Sep. 15, 2009

(54) SHIELD DEVICE WITH RECEIVING CAGES

(75) Inventors: Ping-Chun Chang, Shenzhen (CN); Chao-Chien Lee, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 253 days.

(21) Appl. No.: 11/309,032

(22) Filed: Jun. 12, 2006

(65) Prior Publication Data
US 2007/0125972 A1 Jun. 7, 2007

(30) Foreign Application Priority Data
Nov. 25, 2005 (TW) .............................. 94220516 U

(51) Int. Cl.
*H05K 9/00* (2006.01)
(52) U.S. Cl. ..................................... 361/818
(58) Field of Classification Search ............... 361/818
See application file for complete search history.

(56) References Cited

U.S. PATENT DOCUMENTS

| | | | | |
|---|---|---|---|---|
| 4,570,156 A | * | 2/1986 | Nicholas, Jr. | 340/547 |
| 5,291,368 A | * | 3/1994 | Conroy-Wass | 361/796 |
| 5,339,221 A | * | 8/1994 | Conroy-Wass et al. | 361/796 |
| 5,423,689 A | * | 6/1995 | Valentino | 439/141 |
| 6,000,956 A | * | 12/1999 | Henningsson et al. | 439/95 |
| 6,407,932 B1 | * | 6/2002 | Gaio et al. | 361/818 |
| 6,558,191 B2 | * | 5/2003 | Bright et al. | 439/541.5 |
| 6,657,214 B1 | | 12/2003 | Foegelle et al. | 250/506.1 |
| 6,729,905 B1 | * | 5/2004 | Hwang | 439/607 |
| 6,731,519 B1 | * | 5/2004 | Hwang | 361/818 |
| 6,764,333 B2 | * | 7/2004 | Pocrass | 439/418 |
| 6,867,969 B2 | * | 3/2005 | Hwang | 361/690 |
| 6,972,968 B2 | * | 12/2005 | Hwang | 361/818 |
| 7,357,673 B2 | * | 4/2008 | Long | 439/608 |
| 7,491,901 B2 | * | 2/2009 | Lu | 174/386 |

FOREIGN PATENT DOCUMENTS

WO WO 2004088381 A1 * 10/2004

* cited by examiner

*Primary Examiner*—Thomas P Noland
(74) *Attorney, Agent, or Firm*—Wei Te Chung

(57) ABSTRACT

A shield device for blocking ambient electromagnetic waves from interfering with testing of an electronic product (50) connected with a cable (60), includes a shield cage (10) and a receiving cage (40) for receiving the cable. The shield cage includes a base (30) defining a receiving space (38) for receiving the electronic product, and an opening in communication with the receiving space. The receiving cage received in the opening, includes an upper cover (42) and a lower cover (44). The upper cover defines a recessed portion (422), and the lower cover includes a protrusion (442) received in the recessed portion. When the upper cover is mounted on the lower cover, at least one transition portion (46) is formed in the receiving cage.

18 Claims, 6 Drawing Sheets

SHIELD DEVICE WITH RECEIVING CAGES

FIELD OF THE INVENTION

The present invention relates to shield devices, and particularly to a shield device with a receiving cage for receiving cables.

DESCRIPTION OF RELATED ART

With the rapid development of electronic technology, electronic products, such as, mobile phones, wireless access points, circuit boards, and so on, include more and more functions. During a production process, the electronic products are generally undergone different tests in order to ensure quality of the electronic products. Often, the electronic product is mounted in a shield cage to test whether various functions of the electronic product meet standard requirements.

Referring to FIG. 6, a conventional shield cage is shown. The shield cage includes a cover 70 and a base 80. The base 80 includes four sidewalls 82 and a receiving space 84 bounded by the sidewalls 82. A through hole 86 is defined in one of the sidewalls 82. During a testing process, an electronic product, such as, a circuit board 90, is accommodated in the receiving space 84, and connected to a computer (not shown) via a flexible cable 92 passing through the through hole 86, thereby, various functions of the circuit board 90 are tested. However, in the testing process, ambient electromagnetic waves may enter the shield cage via the through hole 86, and interfere with testing of the circuit board 90, resulting in failure of the testing.

Therefore, a heretofore unaddressed need exists in the industry to overcome the aforementioned deficiencies and inadequacies.

SUMMARY OF THE INVENTION

In an exemplary embodiment, a shield device for blocking ambient electromagnetic waves from interfering with testing of an electronic product connected with a cable, includes a shield cage and a receiving cage for receiving the cable. The shield cage includes a base defining a receiving space for receiving the electronic product, and an opening in communication with the receiving space. The receiving cage received in the opening, includes an upper cover and a lower cover. The upper cover defines a recessed portion, and the lower cover includes a protrusion received in the recessed portion. When the upper cover is mounted on the lower cover, at least one transition portion is formed in the receiving cage.

Other advantages and novel features will become more apparent from the following detailed description when taken in conjunction with the accompanying drawings, in which:

DETAILED DESCRIPTION OF THE INVENTION

Figure 1:
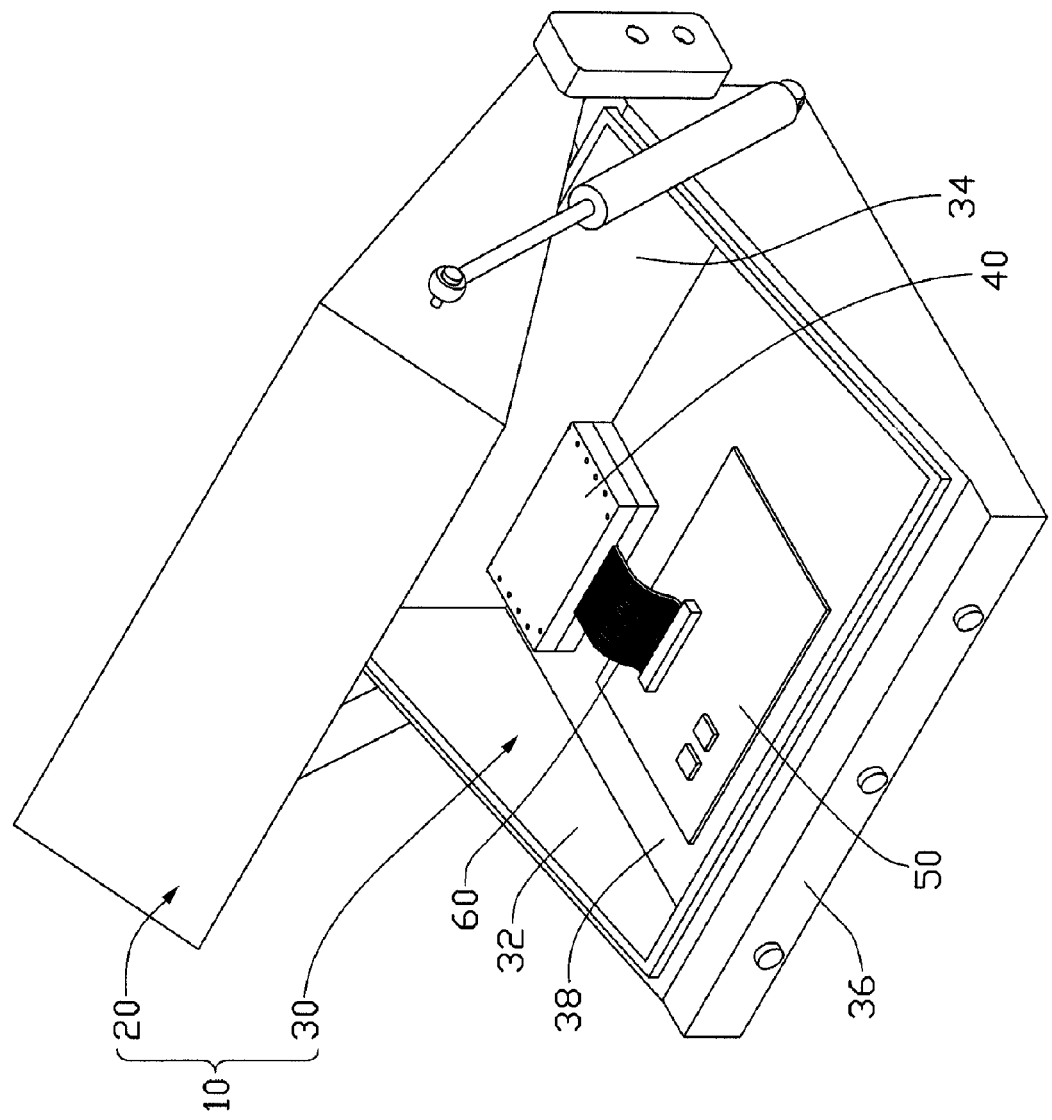
FIG. 1 is an isometric, assembled view of a shield device in accordance with an exemplary embodiment of the present invention, together with a circuit board and a flexible cable.
Figure 2:
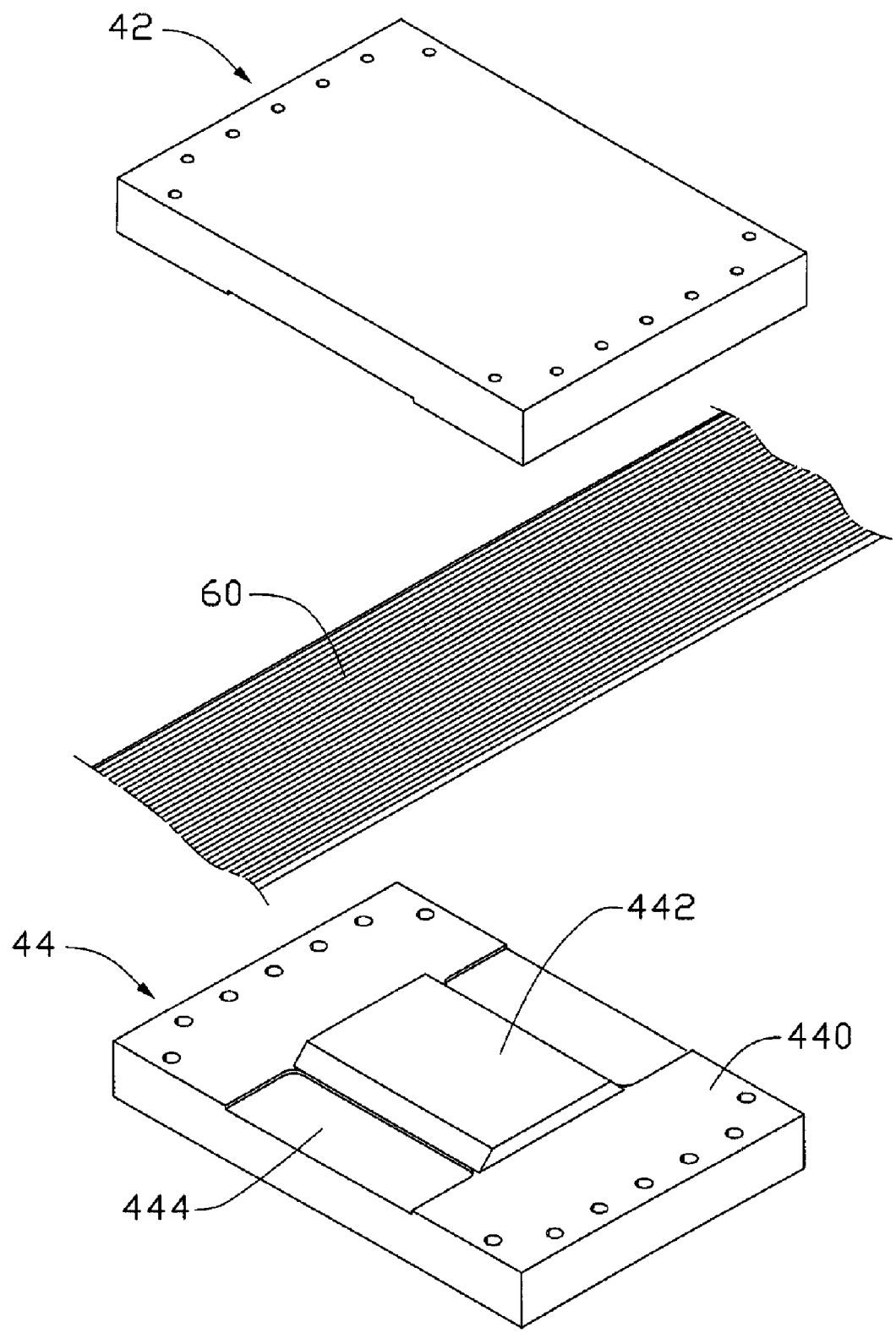
FIG. 2 is an exploded, isometric view of a receiving cage of the shield device and the flexible cable of FIG. 1.
Figure 3:
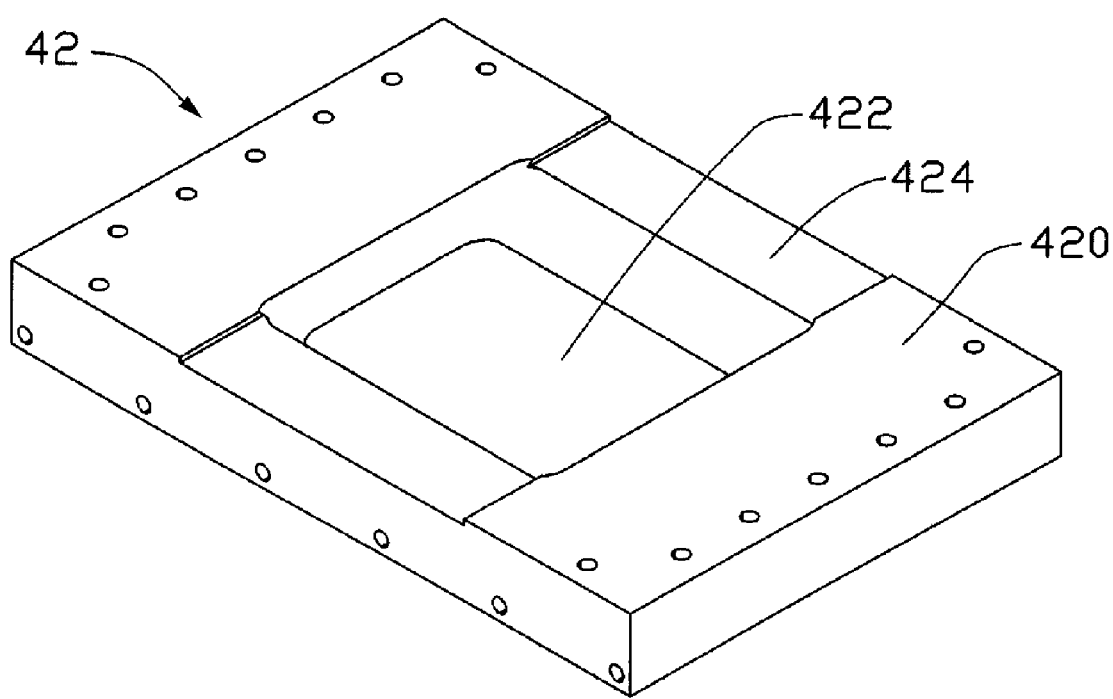
FIG. 3 is an inverted, isometric view of an upper cover of the receiving cage of FIG. 2.
Figure 4:
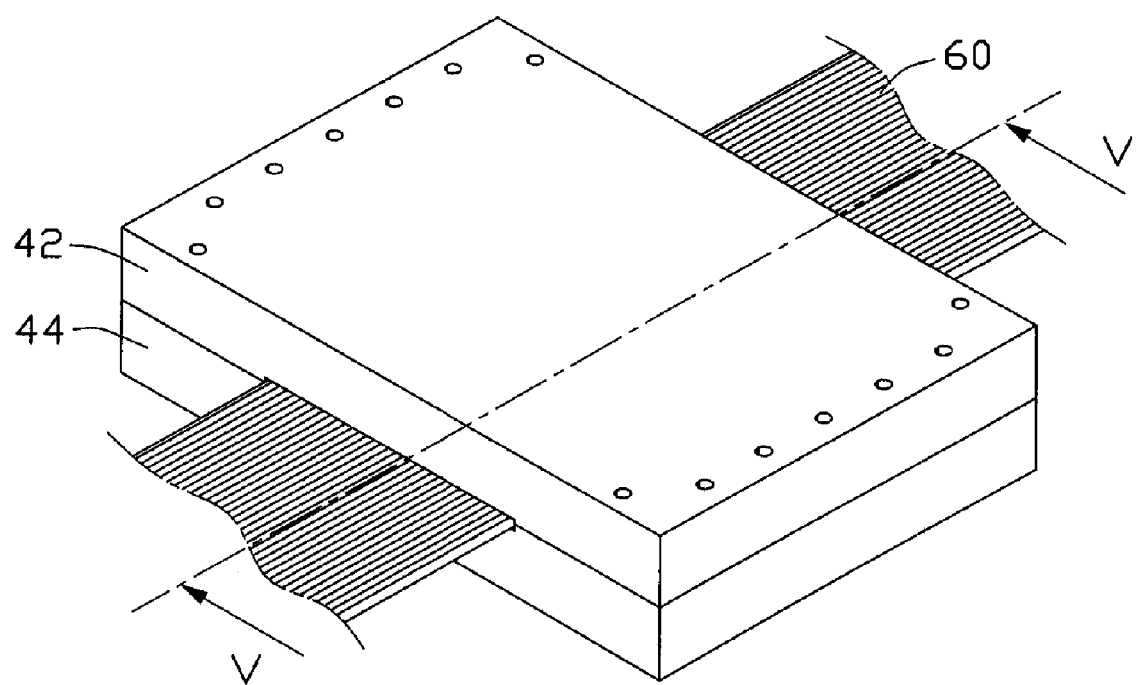
FIG. 4 is an assembled view of FIG. 2.
Figure 5:
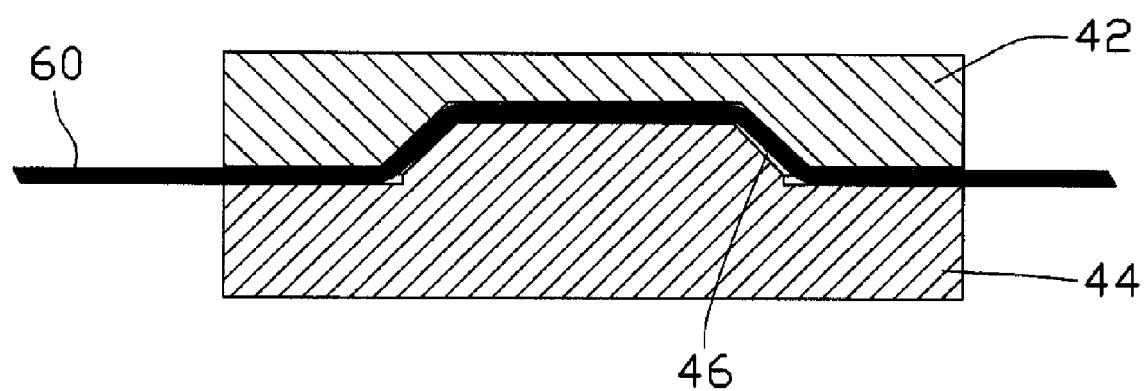
FIG. 5 is a cross-sectional view taken along line V-V of FIG. 4.
Figure 6:
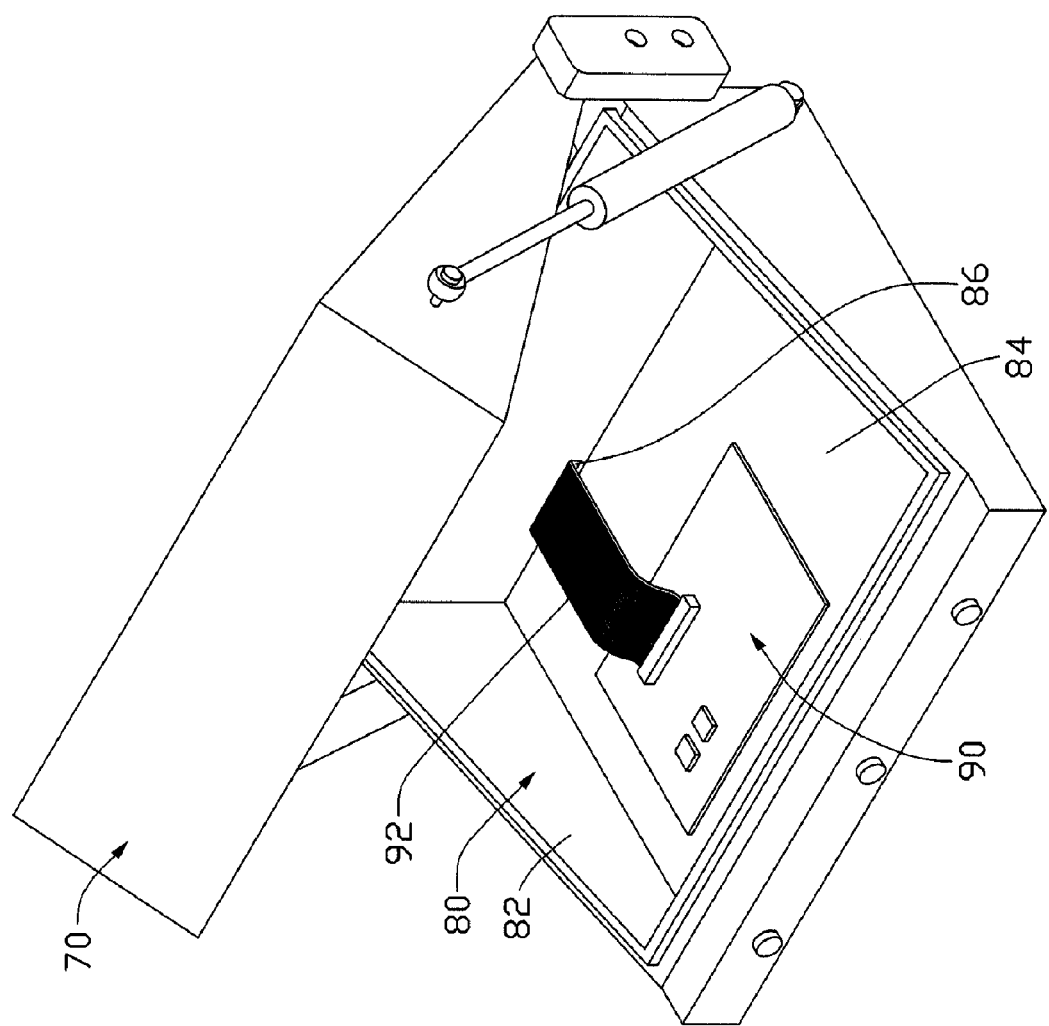
FIG. 6 is an assembled view of a conventional shield cage.

Referring to FIG. 1, an assembled view of a shield device in accordance with an exemplary embodiment of the present invention is used for blocking ambient electromagnetic waves from interfering with testing of an electronic product 50, such as, a circuit board, a mobile phone, and so on, connected with a connective means like a flexible cable 60. The shield device comprises a shield cage 10 for accommodating the electronic product 50, and a receiving cage 40 for receiving the flexible cable 60.

The shield cage 10 comprises a lid 20 and a base 30. The lid 20 and the base 30 contain electromagnetic wave absorbing materials (not shown) to minimize internal electromagnetic wave reflections in the shield cage 10 during a test.

The lid 20 is generally rectangular in shape, and is movable between a sealed position and an open position relative to the base 30.

The base 30 is generally rectangular in shape, and comprises a pair of opposite sidewalls 32, a back wall 34, a front wall 36 opposite to the back wall 34, and a receiving space 38. The receiving space 38 is bounded by the sidewalls 32, the back wall 34, and the front wall 36, for receiving the electronic product 50 during the test. The back wall 34 defines an opening shielded by the receiving cage 40. The opening communicates with the receiving space 38 and an exterior. As an alternative embodiment, there may be two or more openings. Meanwhile, the opening may be defined in the sidewalls 32 or the front wall 36. The base 30 further comprises a compressible electromagnetic interference (EMI) gasket (not labeled) disposed around an inside perimeter thereof for sealing the base 30 when the lid 20 is in the sealed position.

Referring also to FIGS. 2-5, the receiving cage 40 comprises an upper cover 42 and a lower cover 44. The upper cover 42 is generally rectangular in shape, and contains RF absorbing materials (not shown). The upper cover 42 comprises a pair of opposite first end portions 420, a recessed portion 422 defined in a middle thereof, and a pair of opposite first side portions 424 interconnecting with the first end portions 420. The first end portions 420 and the first side portions 424 cooperatively bound the recessed portion 422. A cross-section of the recessed portion 422 is generally trapeziform in shape. A height of each first end portion 420 is greater than that of each first side portion 424.

The lower cover 44 is generally rectangular in shape, and contains RF absorbing materials (not shown). The lower cover 44 comprises a pair of opposite second end portions 440 each corresponding to one of the first end portions 420, a protrusion 442 corresponding to the recessed portion 422, and a pair of opposite second side portions 444 each corresponding to one of the first side portions 424. A height of each second end portion 440 is greater than that of each second side portion 444, and is less than that of the protrusion 442. The protrusion 442 projects from a middle of the lower cover 44, and a cross-section of the protrusion 442 is generally trapeziform in shape.

In assembly, the electronic product 50 is received in the receiving space 38 of the base 30. The flexible cable 60 is mounted in the receiving cage 40. The receiving cage 40 is received in the opening of the base 30 with one end of the flexible cable 60 being connected to the electronic product 50, and the other end of the flexible cable 60 extending out of the base 30. Thus, the flexible cable 60, the electronic product 50, the receiving cage 40, and the shield cage 10 are assembled. In this assembled state, the opening of the base 30 is sealed. The protrusion 442 is received in the recessed portion 422 with the flexible cable 60 being firmly retained between the protrusion 442 and the recessed portion 422.

In use, the other end of the flexible cable 60 is connected to a computer for testing the electronic product 50 (not shown), and the lid 20 is in the sealed position. Thus, various functions of the electronic product 50 can be tested. After the test, the lid 20 is placed in the open position. The electronic product 50 is then taken out of the base 30.

Because the opening of the base 30 is sealed during the test, ambient electromagnetic waves do not penetrate the shield cage 10, and electromagnetic waves generated by the electronic product 50 do not escape the shield cage 10. Accordingly, the shield cage 10 protects electronic product 50 from EMI during testing, and success of the testing of the electronic product 50 is ensured.

Because the cross-sections of the protrusion 442 and the recessed portion 422 of the receiving cage 40 are trapeziform in shape, a pair of transition portions 46 is formed in the receiving cage 40 thus eliminating or reducing any chance gaps between the upper cover 40 and the lower cover 44. Meanwhile, the absorbing material effectively absorbs electromagnetic waves penetrating the receiving cage 40 via any other chance gaps. Accordingly, accurate testing of the electronic product 50 is ensured, and quality of the electronic product 50 can be determined.

As an alternative embodiment, the flexible cable 60 may be a plurality of cables.

While the exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A device for electrically shielding electronic products received therein, comprising:
   a shield cage of said device defining a receiving space therein to receive electronic products and providing electrical shield to said received electronic products, an opening defined through a wall of said shield cage to be spatially communicable said receiving space with an outside of said shield cage and a connective means electrically connectable with said received electronic products extending through said opening toward said outside of said shield cage; and
   a receiving cage removably installable in said shield cage and extending around said opening toward said received electronic products for a preset distance to block said opening and provide further electrical shield to said received electronic products, said receiving cage enclosing parts of said connective means along said preset distance and urging said enclosed parts of said connective means to be non-straightly extendable in said receiving cage.

2. The device as claimed in claim 1, wherein a transition portion is defined in said receiving cage to urge said enclosed parts of said connective means.

3. The device as claimed in claim 2, wherein said transition portion is defined on a protrusion of said receiving cage, and a cross-section of said protrusion is generally trapeziform in shape.

4. The device as claimed in claim 2, wherein said transition portion is defined on a recessed portion of said receiving cage, and a cross-section of said recessed portion is generally trapeziform in shape.

5. The device as claimed in claim 1, wherein said receiving cage comprising a separable upper cover and a lower cover, said upper cover comprises a pair of opposite first end portions, and a pair of opposite first side portions interconnecting the first end portions, the first end portions and the first side portions cooperatively bounding a receiving space for said parts of said connective means.

6. The device as claimed in claim 5, wherein a height of each of the first end portions is greater than that of each of the first side portions.

7. The device as claimed in claim 5, wherein the lower cover comprises a pair of opposite second end portions, a pair of opposite second side portions interconnecting the second end portions, and a protrusion formed therebetween.

8. The device as claimed in claim 7, wherein a height of each of the second end portions is greater than that of each of the second side portions, and is less than that of the protrusion.

9. A device for electrically shielding electronic products received therein, comprising:
   a shield cage of said device defining a receiving space therein to receive electronic products and providing electrical shield to said received electronic products, an opening defined through a wall of said shield cage to be spatially communicable said receiving space with an outside of said shield cage, a connective means electrically connectable with said received electronic products extending through said opening toward said outside of said shield cage; and
   a receiving cage removably installable in said shield cage and extending round said opening toward said received electronic products for a preset distance to block said opening and provide further electrical shield to said received electronic products, said receiving cage defining a first engaging portion and a second engaging portion therein, said second engaging portion shaped differently from said first engaging portion and complementarily engagable with said first engaging portion, said receiving cage enclosing parts of said connective means along said preset distance by said first engaging portion and said second engaging portion cooperatively.

10. The device as claimed in claim 9, wherein at least one transition portion is formed when said receiving cage encloses said parts of said connective means by said first engaging portion and said second engaging portion cooperatively.

11. The device as claimed in claim 9, wherein said first engaging portion is a protrusion, and a cross-section of the protrusion is generally trapeziform in shape.

12. The device as claimed in claim 9, wherein said second engaging portion is a recessed portion, and a cross-section of the recessed portion generally trapeziform in shape.

13. The device as claimed in claim 9, wherein said receiving cage comprises an upper cover defining said first engaging portion, and a lower cover separable from said upper cover and defining said second engaging portion.

14. The device as claimed in claim 13, wherein said upper cover comprises a pair of opposite first end portions, and a pair of opposite first side portions interconnecting the fast end portions, the first end portions and the first side portions cooperatively bound a receiving space for said parts of said connective means.

15. The device as claimed in claim 14, wherein a height of each of the first end portions is greater than that of each of the first side portions.

16. The device as claimed in claim 13, wherein the lower cover comprises a pair of opposite second end portions, and a pair of opposite second side portions interconnecting the second portions.

17. The device as claimed in claim 16, wherein a height of each of the second end portions is greater than that of the second side portions, and is less than that of said second engaging portion.

18. The device as claimed in claim 9, wherein said shield cage comprises a base, the base comprises a pair of opposite sidewalls, a back wall, and a front wall cooperatively defining the receiving space.

* * * * *

UNITED STATES PATENT AND TRADEMARK OFFICE
CERTIFICATE OF CORRECTION

PATENT NO. : 7,589,979 B2 Page 1 of 1
APPLICATION NO. : 11/309032
DATED : September 15, 2009
INVENTOR(S) : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 348 days.

Signed and Sealed this

Twenty-first Day of September, 2010

David J. Kappos
*Director of the United States Patent and Trademark Office*